(12) United States Patent
Morimoto et al.

(10) Patent No.: US 6,603,287 B2
(45) Date of Patent: Aug. 5, 2003

(54) DEVICE FOR DETERMINING PHYSICAL QUANTITY OF BATTERY PACK

(75) Inventors: Naohisa Morimoto, Toyohashi (JP); Ichiro Maki, Kokohama (JP)

(73) Assignees: Matsushita Electric Industrial Co., Ltd., Osaka (JP); Toyota Jidosha Kabushiki Kaisha, Aichi (JP)

( * ) Notice: Subject to any disclaimer, the term of this patent is extended or adjusted under 35 U.S.C. 154(b) by 0 days.

(21) Appl. No.: 10/119,572

(22) Filed: Apr. 9, 2002

(65) Prior Publication Data

US 2002/0149357 A1 Oct. 17, 2002

(30) Foreign Application Priority Data

Apr. 16, 2001 (JP) .......................................... 2001-117195

(51) Int. Cl.$^7$ ................................................. H02J 7/16
(52) U.S. Cl. ....................................................... 320/150
(58) Field of Search ................................. 320/150, 152, 320/153, 154; 324/426, 427, 431, 441; 340/636

(56) References Cited

U.S. PATENT DOCUMENTS

| 4,947,123 A | 8/1990 | Minezawa | 324/427 |
| 5,434,495 A | 7/1995 | Toko | 320/135 |
| 6,074,089 A | 6/2000 | Hollander et al. | 374/181 |
| 6,075,339 A * | 6/2000 | Reipur et al. | 320/150 |

FOREIGN PATENT DOCUMENTS

| JP | 2000-146620 A | 5/2000 |
| JP | 2000-417933 * | 5/2000 |

OTHER PUBLICATIONS

European Search Report.

* cited by examiner

Primary Examiner—Edward H. Tso
Assistant Examiner—Pia Tibbits
(74) Attorney, Agent, or Firm—Merchant & Gould P.C.

(57) ABSTRACT

A device is provided that allows a physical quantity of a battery pack to be determined at low cost with high accuracy with respect to variations in environmental temperature. A voltage regulator supplies a temperature detecting part and an A/D converter with reference voltages as a reference voltage for detection and a reference voltage for conversion, respectively, and supplies a storage part and a signal processing part with the reference voltage as a supply voltage. Based on signal levels obtained from physical quantity detecting parts and the temperature detecting part via the A/D converter so as to correspond to a plurality of temperatures in a predetermined temperature range, which have been stored in the storage part, a signal level obtained from the physical quantity detecting part via the A/D converter is corrected in the signal processing part.

6 Claims, 4 Drawing Sheets

DEVICE FOR DETERMINING PHYSICAL QUANTITY OF BATTERY PACK

BACKGROUND OF THE INVENTION

1. Field of the Invention

The present invention relates generally to a device for determining voltage, electric current, temperature, and the like as physical quantities of a secondary battery to be mounted in a motor-driven vehicle such as an electric automobile or a hybrid vehicle, an uninterruptible power supply, a backup power supply, or the like. More specifically, this invention relates to a technique for accurately determining the physical quantities with respect to variations in environmental temperature of the device.

2. Related Background Art

Secondary batteries include a lead battery, a nickel-cadmium (Ni—Cd) battery, a nickel-metal hydride (Ni—MH) battery, a lithium-ion battery, and the like. These batteries have the following property. When the battery becomes exhausted, recharging can be performed by connecting the battery to an external power source so that a predetermined electric current is fed to the battery. Conventionally, this property has allowed these batteries to be used in various equipment.

For example, the battery is mounted in a vehicle to serve as a battery for supplying a spark plug of an engine with power when starting the engine. Recently, the Ni—MH battery has been used also as a main power source for driving a motor in an electric automobile and a so-called hybrid vehicle that is provided with an engine and a motor. In this case, the Ni—MH battery is used in the form of a battery pack as a combined body of a plurality of single secondary battery cells.

In the hybrid vehicle, the following are performed depending on an output level of the engine. When the output level of the engine is higher than a power level required for driving the vehicle, excess power is used to drive a generator so that the secondary battery is charged. On the contrary, when the output level of the engine is lower than the power level required for driving the vehicle, electric power from the secondary battery is used to drive the motor so that power to compensate for the power shortage is output. In this case, the secondary battery is discharged. It is necessary for the charging/discharging or the like to be controlled so that a proper operating state is maintained when a secondary battery is mounted in a hybrid vehicle or the like.

In order to meet the aforementioned requirement, output voltage, charge/discharge current, internal temperature, and the like of a battery pack are detected, and based on a result of the detection, a state of charge (SOC) of a battery is estimated. Based on a result of the estimation, the SOC is controlled so that the highest fuel consumption efficiency of a vehicle can be obtained. Accordingly, in order for the SOC of the battery to be controlled with reliability, it has been required to determine a physical quantity of the battery pack such as the output voltage, the charge/discharge current, the internal temperature, and the like with accuracy, regardless of variations in environmental temperature.

Conventionally, as shown in FIG. 3, a physical quantity of a battery pack has been determined in the following manner. Signals VB, IB, and TB from sensors (not shown) for detecting output voltage, charge/discharge current, and internal temperature of a battery pack 1 are received by an electronic controlling unit 30 (ECU). The respective signals VB, IB, and TB as analog signals are converted into digital signals in chronological order by an A/D converter 31 provided in the ECU 30. The respective physical quantities are determined by a microcomputer 32 or the like that is supplied with a supply voltage VO by a voltage regulator 33. Based on a result of the determination, an SOC of the battery pack 1 is estimated. A reference voltage VR for conversion performed in the A/D converter 31 is supplied by a reference voltage generating IC 34 that has a very low temperature coefficient (for example, a variation rate of a reference voltage is not more than 0.1% at temperatures ranging from −30° C. to +80° C.) and achieves high accuracy and high stability, so that the physical quantities are determined accurately with respect to variations in environmental temperature.

Furthermore, a technique has been proposed, in which as shown in FIG. 3, an environmental temperature TE is determined, and based on the result of the determination, temperature characteristics of a circuit system from the sensors for detecting the respective physical quantities to the A/D converter 31 in the ECU 30 are corrected (for example, JP2000-146620 A).

As has always been the case, the reference voltage generating IC 34 for generating a reference voltage with respect to the A/D converter 31 is used so that data as a result of conversion in the A/D converter 31 can be obtained with accuracy. The reference voltage generating IC provides the advantages of high accuracy and high stability. However, in obtaining the advantages, the reference voltage generating IC has been a cause of a substantial cost increase.

SUMMARY OF THE INVENTION

With the foregoing in mind, it is an object of the present invention to provide a device that allows a physical quantity of a battery pack to be determined at low cost with high accuracy with respect to variations in environmental temperature.

In order to achieve the aforementioned object, a device for determining a physical quantity of a battery pack of the present invention is a device for determining a physical quantity of a battery pack as a combined body of a plurality of single secondary battery cells. The device includes a physical quantity detecting part for generating a signal of a level corresponding to a value of a physical quantity of the battery pack to be detected, a temperature detecting part for generating a signal of a level corresponding to an ambient temperature in the device, and an A/D converter for converting analog signals from the physical quantity detecting part and the temperature detecting part into digital signals. The device further includes a storage part for storing in advance signal levels that are obtained from the physical quantity detecting part and the temperature detecting part via the A/D converter so as to correspond to a plurality of temperatures in a predetermined temperature range, a signal processing part for correcting a signal level obtained from the physical quantity detecting part via the A/D converter, based on the signal levels corresponding to the plurality of temperatures that have been stored in the storage part, and a voltage regulator for regulating a voltage level of an input power source to supply the temperature detecting part and the A/D converter with reference voltages as a reference voltage for detection and a reference voltage for conversion, respectively, and supply the storage part and the signal processing part with the reference voltage as a supply voltage. In this case, the secondary batteries are connected in series.

In this configuration, generally, the supply voltage that is supplied to the storage part and the signal processing part by the voltage regulator (such as a voltage regulator IC for general purpose use) varies within a range of voltage values that allow the storage part and the signal processing part to operate properly, depending on a temperature in the predetermined temperature range. The supply voltage that varies with varying environmental temperatures also is supplied to the temperature detecting part and the A/D converter as the reference voltage for detection and the reference voltage for conversion, respectively. The signal levels from the physical quantity detecting part and the temperature detecting part are stored in advance in the storage part via the A/D converter so as to correspond to the plurality of temperatures in the predetermined temperature range. In an actual determination of the physical quantity, based on the signal levels that are stored in advance in the storage part, a signal level from the physical quantity detecting part is corrected in the signal processing part, so that the physical quantity can be determined with accuracy. Furthermore, this configuration does not require the use of the costly reference voltage generating IC that has been used conventionally. In the configuration, a voltage regulator IC for general purpose use, which has been mounted as the voltage regulator for supplying the supply voltage to the signal processing part and the like, also can be used as an IC for generating the reference voltage with respect to the temperature detecting part and the A/D converter, thereby reducing the cost of manufacturing the device.

In the device for determining the physical quantity of the battery pack of the present invention, the physical quantity to be detected is at least one selected from the group consisting of the output voltage of the battery pack, the charge/discharge current of the battery pack, and the temperature in the battery pack.

Furthermore, preferably, the temperature detecting part includes a fixed resistance element and a thermosensitive resistance element, by which the reference supply voltage from the voltage regulator is divided to be output therefrom. According to this configuration, an output from the A/D converter, which corresponds to an environmental temperature in a temperature variation range, can be obtained by using a simple configuration. This can be achieved by, for example, setting the fixed resistance element and the thermosensitive resistance element such as a thermistor element to have equal resistance values at a temperature having a central temperature value in the predetermined temperature range.

Moreover, preferably, the temperature detecting part is provided so as to be adjacent to the voltage regulator. According to this configuration, variations in output voltage of the voltage regulator with respect to variations in environmental temperature can be reflected with accuracy into a physical quantity value that has been determined.

In addition, preferably, in the storage part, the signal levels, each of which is output from the physical quantity detecting part so as to correspond to a reference value of the physical quantity to be detected that has been supplied to the physical quantity detecting part, are stored in advance so as to correspond to the plurality of temperatures. According to this configuration, based on the reference value of the physical quantity to be detected that corresponds to the ambient temperature from the temperature detecting part, in an actual determination of the physical quantity, a signal level from the physical quantity detecting part is corrected in the signal processing part. Thus, the physical quantity can be determined with higher accuracy by correcting temperature characteristics in the physical quantity detecting part.

DETAILED DESCRIPTION OF THE INVENTION

Hereinafter, the present invention will be described by way of a preferable embodiment with reference to the appended drawings.

Figure 1:
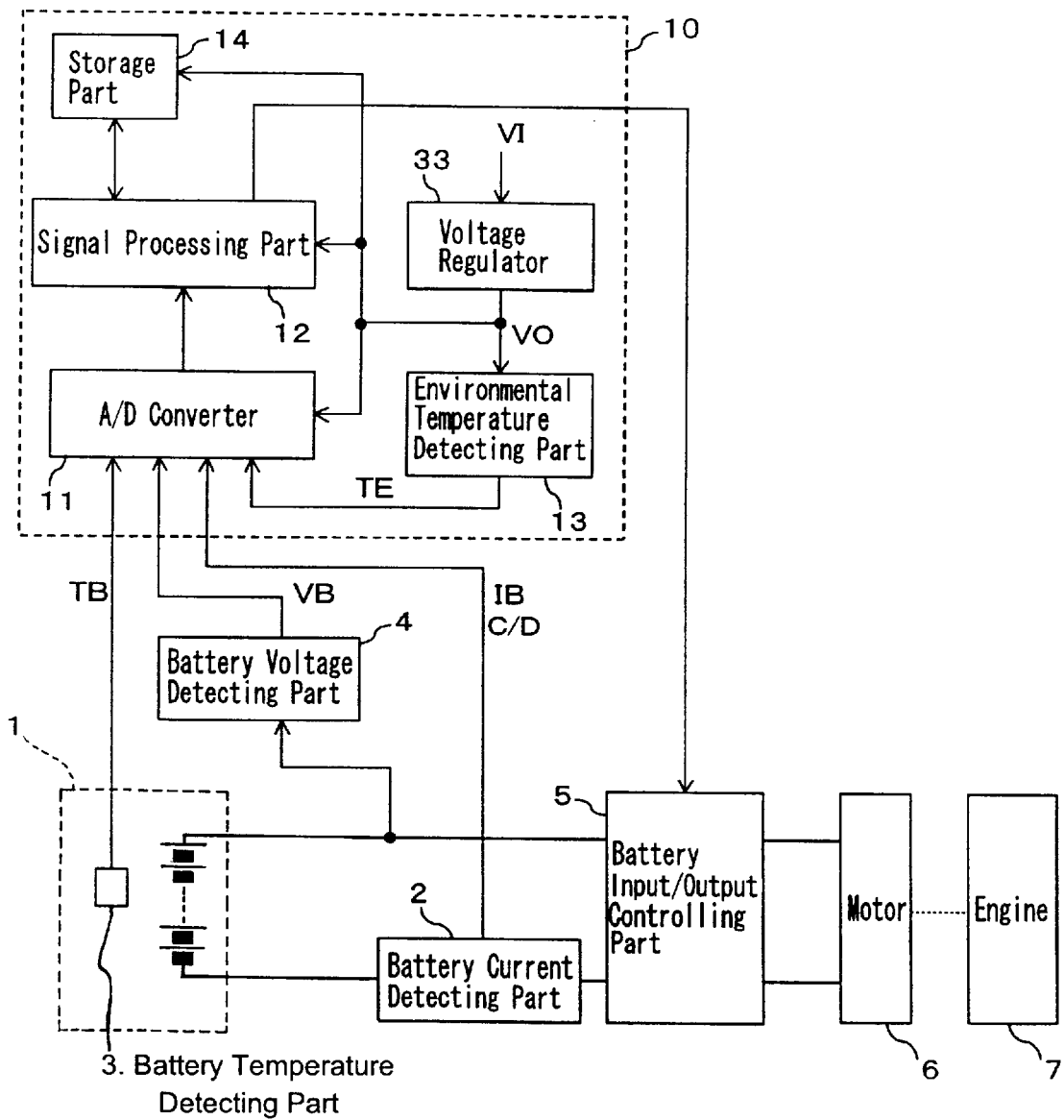
FIG. 1 is a block diagram showing an example of a configuration of a device for determining a physical quantity of a battery pack according to an embodiment of the present invention.

FIG. 1 is a block diagram showing an example of a configuration of a device for determining a physical quantity of a battery pack according to an embodiment of the present invention.

In FIG. 1, reference numeral 1 denotes a battery pack to be mounted in a hybrid vehicle, which is formed of a secondary battery such as a nickel-metal hydride battery. Generally, the battery pack 1 is formed of a battery pack formed of a plurality of battery modules that are connected electrically in series so that a predetermined output is provided with respect to a motor 6. The battery module is formed of a plurality of single battery cells of a nickel-metal hydride battery that are connected electrically in series.

Further, reference numeral 2 denotes a battery current detecting part that is provided between a negative output-terminal of the battery pack 1 and a negative input-terminal of the motor 6. The battery current detecting part 2 detects the charge/discharge current of the battery pack 1 using a current sensor (not shown). In the detection, as well as a current magnitude value IB, a charge/discharge direction C/D is detected from a sign of the charge/discharge current, which shows whether an operation being performed is charging or discharging.

Further, reference numeral 3 denotes a battery temperature detecting part for detecting a battery temperature TB using a temperature sensor (not shown) disposed in a predetermined position in the battery pack 1.

Further, reference numeral 4 denotes a battery voltage detecting part for detecting an output voltage VB as an output voltage per battery cell in the battery pack 1.

The charge/discharge current value IB and the charge/discharge direction C/D from the battery current detecting part 2, the battery temperature TB from the battery temperature detecting part 3, and the battery voltage VB from the battery voltage detecting part 4 are input to an A/D converter 11 in an electronic controlling unit (ECU) 10, respectively, for conversion from an analog signal to a digital signal that is performed in chronological order. Then, based on the results of the conversion, i.e. a current sample IB (n), the charge/discharge direction C/D, a temperature sample TB (n), and a voltage sample VB (n), a state of charge (SOC) of the battery pack 1 is determined by computation in a signal processing part 12.

Further, reference numeral 5 denotes a battery input/output controlling part. In the battery input/output controlling part 5, based on a current level of the state of charge as a result of the computation by the signal processing part 12, charging and discharging are performed with respect to the battery pack 1 so that the battery pack 1 maintains a constant level of the state of charge that falls within a predetermined range. Furthermore, in the battery charge/discharge controlling part 5, according to a request for battery input/output that is made by a driver as in accelerating and decelerating operations, power assist for an engine 7 and regenerative braking are performed by controlling discharge and charge amounts with respect to the battery pack 1.

In the ECU 10, a voltage regulator 33 is provided to generate an output voltage VO (for example, a voltage of+5 V) that has been regulated under a predetermined input voltage VI (for example, a voltage of+12 V). The output voltage VO is supplied to the signal processing part 12 and a storage part 14 that will be described later. The output voltage VO is supplied further to the A/D converter 11 and an environmental temperature detecting part 13 that will be described later as a reference voltage for conversion and a reference voltage for detection, respectively.

The voltage regulator 33 is composed, for example, of a voltage regulator IC for general purpose use. In the voltage regulator 33, the output voltage VO (for example, a voltage of+5 V) varies within a range of voltage values that allow logic circuits of the signal processing part 12 and the storage part 14 to operate properly, depending on a temperature in a predetermined temperature range. The output voltage VO varies in this manner, for example, even when environmental temperature varies±50 degrees from+25° C. (i.e. from −25° C. to+75° C.). The output voltage VO has a variation range of, for example,+5 V±0.025 V (i.e. a variation rate of 0.5%). In this case, the output voltage VO of the voltage regulator 33 has a temperature coefficient of 0.01%/degree.

The environmental temperature detecting part 13 is composed of a fixed resistance element and a thermistor or the like that are connected in series. In the environmental temperature detecting part 13, the output voltage VO from the voltage regulator 33 is divided so that a signal TE of a level corresponding to the environmental temperature is output from the environmental temperature detecting part 13. Initially, the signals TE, which have been detected in the environmental temperature detecting part 13 at a plurality of temperatures in the predetermined range of the environmental temperature, for example, −25° C., 25° C., and 75° C., are supplied to the A/D converter 11. In the A/D converter 11, the signals TE as analog signals are converted into digital signals DTE and stored in the storage part 14 via the signal processing part 12.

In the environmental temperature detecting part 13, the fixed resistance element is assumed to have a resistance value of 10 kΩ, and the thermistor is assumed to have resistance values of 10 kΩ at an environmental temperature of 25° C., 91.27 kΩ at an environmental temperature of −25° C., and 1.992 kΩ at an environmental temperature of 75° C. The A/D converter 11 has a resolution of 10 bits (an output level of 0 to 1,024), and the temperature coefficient of the output voltage VO of the voltage regulator 33 is 0.01%/degree. Therefore, the reference voltage has values of 5 V at the environmental temperature of 25° C., 4.975 V at the environmental temperature of −25° C., and 5.025 V at the environmental temperature of 75° C.

Figure 2A:
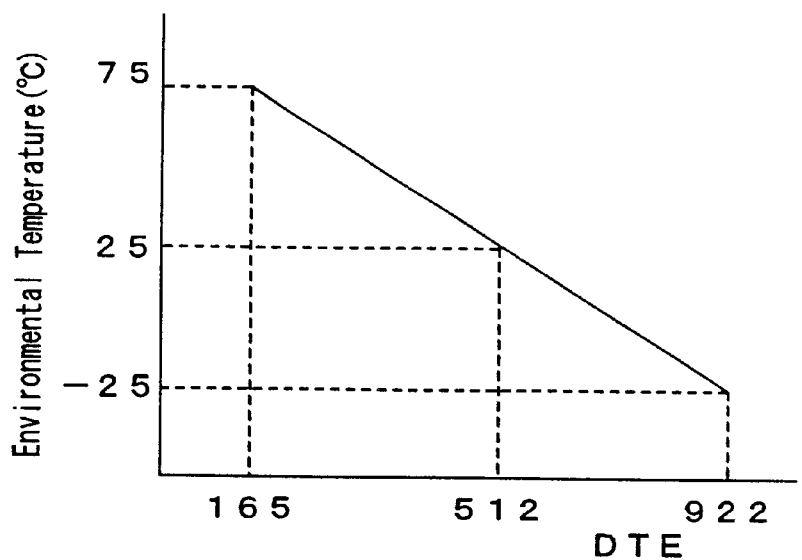
FIG. 2A is a graph showing the relationship between environmental temperature and a digital signal DTE.

In this case, the signal TE that is output from the environmental temperature detecting part has values of 2.5 V at the environmental temperature of 25° C., 4.48 V at the environmental temperature of −25° C., and 0.81 V at the environmental temperature of 75° C. Therefore, the digital signal DTE that is output from the A/D converter 11 has levels of"512", "922", and"165" at the respective environmental temperatures. The levels of the digital signals DTE that correspond to the environmental temperatures are stored in advance in the storage part 14. FIG. 2A shows the relationship between the level of the digital signal DTE and the environmental temperature. In FIG. 2A, the environmental temperature is set to be −25° C., 25° C., and 75° C., and the digital signal DTE is determined at the respective set temperatures. As for the determination of the digital signal DTE at temperatures between the respective set temperatures, for example, interpolation is employed for computation. The digital signal DTE thus determined is stored in the storage part 14.

Figure 2B:
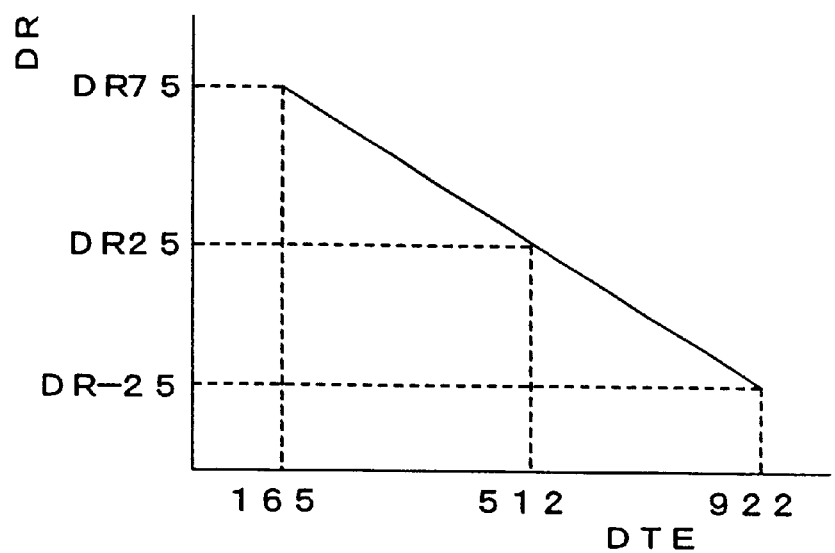
FIG. 2B is a graph showing the relationship between digital signal DTE and a digital signal DR of a physical quantity reference value corresponding to the digital signal DTE.
Figure 3:
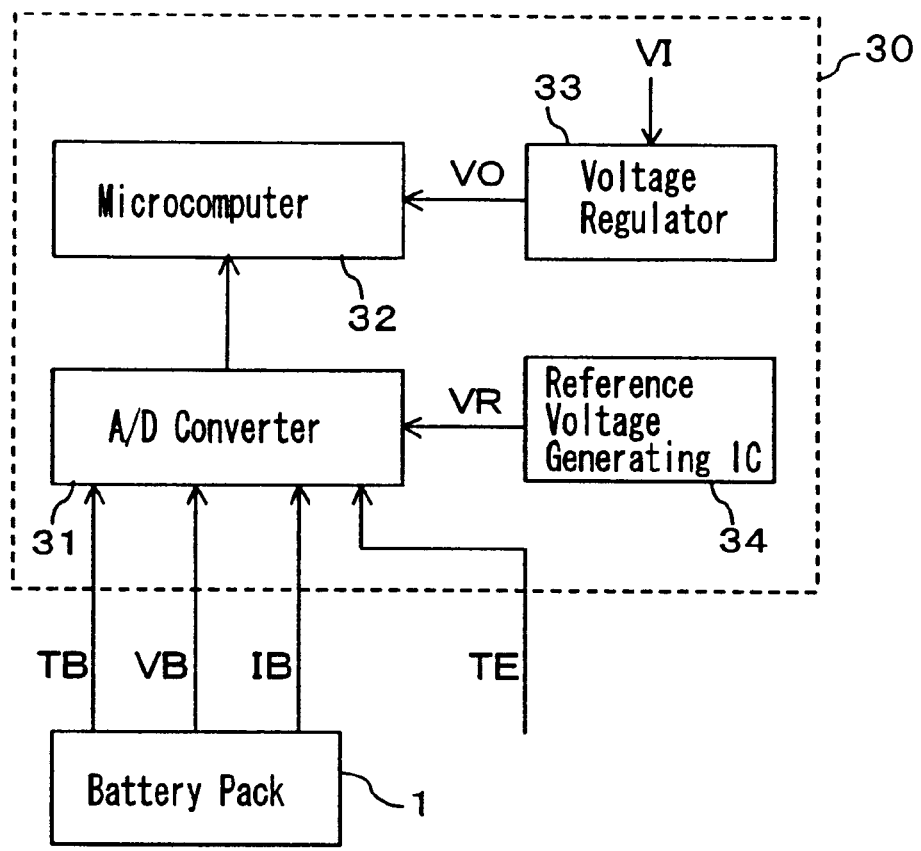
FIG. 3 is a block diagram showing an example of a configuration of a conventional device for determining a physical quantity of a battery pack.

FIG. 2B shows the relationship between the digital signal DTE and digital signals DIR, DTR, and DVR (represented by DR in the figure) when the environmental temperature is set to be 25° C., −25° C. and 75° C. In FIG. 2B, at the respective set temperatures, reference values with respect to current, temperature, and voltage of the battery pack 1 are input to the battery current detecting part 2, the battery temperature detecting part 3, and the battery voltage detecting part 4, respectively. The digital signals DIR, DTR and DVR that correspond to the respective reference values are output from the A/D converter. The digital signals DIR, DTR, and DVR with respect to the physical quantity reference values, along with the digital signal DTE corresponding to the environmental temperature, are stored in the storage part 14 as data in a look-up table.

In an actual determination of the voltage sample VB (n), the current sample IB (n), and the temperature sample TB (n), the digital signals DIR, DTR, and DVR that correspond to the digital signal DTE are read out from the storage part 14. Based on the digital signals DIR, DTR, and DVR that have been read out, a physical quantity value that has been determined is corrected in the signal processing part 12. According to this configuration, a physical quantity can be determined with accuracy by balancing variations in the reference voltage of the A/D converter 11 with respect to variations in environmental temperature and variations in voltage for detection performed in the battery current detecting part 2, the battery temperature detecting part 3, and the battery voltage detecting part 4, thereby allowing SOC controlling to be performed with reliability.

Figure 4:
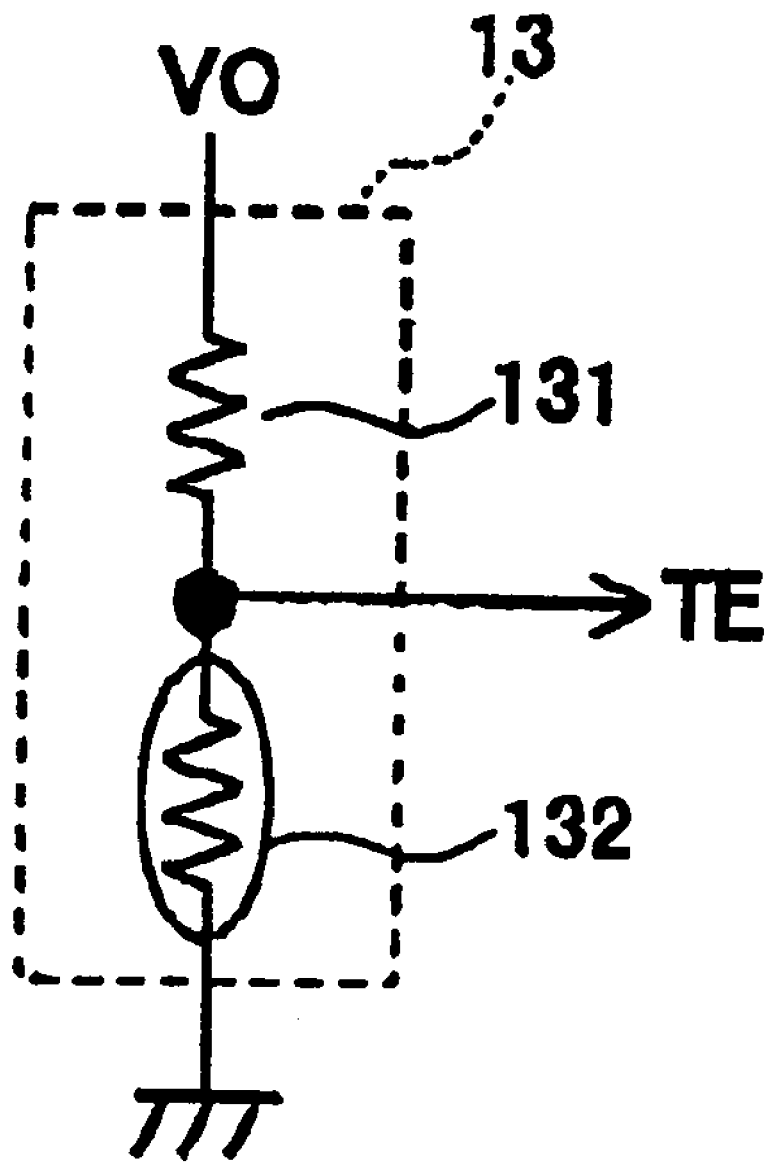
FIG. 4 is a schematic diagram of an environmental temperature detecting part within a device for determining a physical quantity of a battery pack as a combined body of a plurality of single secondary battery cells, according to an embodiment of the present invention.

FIG. 4 is a schematic diagram of an environmental temperature detecting part 13 within a device for determining a physical quantity of a battery pack as a combined body of a plurality of single secondary battery cells, according to an embodiment of the present invention. The environmental temperature detecting part 13 shown comprises a fixed resistance element 131 that is tied to the output voltage VO and the signal TE. The temperature detecting part 13 further comprises a thermosensitive element 132 that is tied to both the signal TE and ground.

As discussed in the foregoing description, the present invention has the particular effect of providing a device that allows a physical quantity of a battery pack such as output voltage, charge/discharge current, and internal temperature to be determined at low cost with high accuracy regardless of variations in environmental temperature.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A device for determining a physical quantity of a battery pack as a combined body of a plurality of a single secondary battery cells, comprising:

a physical quantity detecting part for generating a signal of a level corresponding to a value of physical quantity of the battery pack to be detected;

an environmental temperature detecting part for generating a signal of a level corresponding to an ambient temperature in the device;

an A/D converter for converting analog signals from the physical quantity detecting part and the environmental temperature detecting part into digital signals;

a storage part for storing in advance signal levels that are obtained from the physical quantity detecting part and the environmental temperature detecting part via the A/D converter so as to correspond to a plurality of environmental temperatures in a predetermined temperature range;

a signal processing part for correcting a signal level obtained from the physical quantity detecting part via the A/D converter, based on the signal levels corresponding to the plurality of environmental temperatures that have been stored in the storage part; and a voltage regulator for regulating a voltage level of an input power source to supply the environmental temperature detecting part and the A/D converter with reference voltages as a reference voltage for detection and a reference voltage for conversion, respectively, and supply the storage part and the signal processing part with the reference voltage as a supply voltage.

2. The device for determining the physical quantity of the battery pack according to claim 1, wherein the physical quantity to be detected is at least one selected from the group consisting of output voltage of the battery pack, charge/discharge current of the battery pack, and temperature in the battery pack.

3. The device for determining the physical quantity of the battery pack according to claim 1, wherein the environmental temperature detecting part includes a fixed resistance element and a thermosensitive resistance element, by which the reference supply voltage from the voltage regulator is divided to be output therefrom.

4. The device for determining the physical quantity of the battery pack according to claim 1, wherein the environmental temperature detecting part is provided so as to be adjacent to the voltage regulator.

5. The device for determining the physical quantity-of the battery pack according to claim 1, wherein in the storage part, the signal levels, each of which is output from the physical quantity detection part so as to correspond to a reference value of the physical quantity to be detected that has been supplied to the physical quantity detecting part, are stored in advance so as to correspond to the plurality of environmental temperatures.

6. The device for determining the physical quantity of the battery pack according to claim 1, wherein the secondary batteries are connected in series.

* * * * *